United States Patent
Van Der Lei et al.

(10) Patent No.: US 6,348,303 B1
(45) Date of Patent: Feb. 19, 2002

(54) LITHOGRAPHIC PROJECTION APPARATUS

(75) Inventors: Sijbe A. H. Van Der Lei, Veldhoven;
Rard Willem De Leeuw, Eindhoven;
Gerrit Maarten Bonnema, Eindhoven;
Wilhelmus Maria Corbeij, Eindhoven,
all of (NL)

(73) Assignee: ASM Lithography B.V., Veldhoven (NL)

( * ) Notice: Subject to any disclaimer, the term of this patent is extended or adjusted under 35 U.S.C. 154(b) by 0 days.

(21) Appl. No.: 09/290,554

(22) Filed: Apr. 12, 1999

(30) Foreign Application Priority Data

Apr. 14, 1998 (EP) .............................................. 98201171

(51) Int. Cl.$^7$ .............................. G03F 7/20; G03C 5/00; G03B 27/32
(52) U.S. Cl. ........................ 430/397; 430/302; 430/394; 355/53; 355/55
(58) Field of Search ................................ 430/394, 322, 430/397, 302; 355/53, 55

(56) References Cited

U.S. PATENT DOCUMENTS

| | | | |
|---|---|---|---|
| 5,473,410 A | 12/1995 | Nishi | 355/53 |
| 5,591,958 A | 1/1997 | Nishi et al. | 250/205 |
| 5,663,784 A | 9/1997 | Tanimoto | 355/68 |
| 5,969,441 A * | 10/1999 | Loopstra et al. | 310/12 |
| 6,046,792 A * | 4/2000 | Van Der Werf et al. | 355/53 |
| 6,078,381 A * | 6/2000 | Suzuki | 355/53 |
| 6,100,515 A * | 8/2000 | Nishi et al. | 250/205 |

FOREIGN PATENT DOCUMENTS

| | | |
|---|---|---|
| EP | 0444 937 A2 | 9/1991 |
| EP | 0 633 506 A1 | 1/1995 |
| EP | 0 833 209 A2 | 4/1998 |
| WO | 9840791 * | 9/1998 |

OTHER PUBLICATIONS

Patent Abstracts of Japan, Publication No. 08008160 A, publication date Jan. 12, 1996, Applicatin No. 06135616, filed Jun. 17, 1994—Makinouchi Susumu.
Patent Abstracts of Japan, Publication No. 07050247 A, publication dated Feb. 21, 1995, No. 05195684, filed Aug. 6, 1993—Uchida Gen et al.

* cited by examiner

Primary Examiner—Shean C. Wu
(74) Attorney, Agent, or Firm—Pillsbury Winthrop LLP

(57) ABSTRACT

A lithographic apparatus of the scanning type in which reticle masking blades 7 are opened at the beginning of a scan. Means are provided to compensate for an increase in the intensity density of the illumination beam as the reticle masking blades are opened. These means may comprise lamp control means 10 for controlling a compensating decrease in the lamp intensity. The reticle masking blades 70 may be manufactured of, e.g., quartz and provided with a reflective rear coating, e.g. of aluminum, so that portions of the illumination beam intercepted by the reticle masking blades are totally internally reflected.

15 Claims, 3 Drawing Sheets

LITHOGRAPHIC PROJECTION APPARATUS

BACKGROUND OF THE INVENTION

1. Field of the Invention

The present invention relates to dose control in a lithographic projection apparatus.

2. Description of Related Art

For the sake of simplicity, the projection system may hereinafter be referred to as the "lens"; however, this term should be broadly interpreted as encompassing various types of projection system, including refractive optics, reflective optics and catadioptric systems, for example. The radiation system may also include elements operating according to any of these principles for directing, shaping or controlling the projection beam of radiation and such elements may also be referred to below, collectively or singularly, as a "lens". Any refractive, reflective or catadioptric elements in the radiation or illumination systems may be based on a substrate of glass or another suitable material, and may be provided with either single- or multi-layer coatings as desired. In addition, the first and second object tables may be referred to as the "mask table" and the "substrate table", respectively. Further, the lithographic apparatus may be of a type having two or more mask tables and/or two or more substrate tables. In such "multiple stage" devices the additional tables may be used in parallel or preparatory steps may be carried out on one or more stages while one or more other stages are being used for exposures. Twin stage lithographic apparatuses are described in International Patent Applications WO 98/28665 and WO 98/40791.

Lithographic projection apparatuses can be used, for example, in the manufacture of integrated circuits (ICs). In such a case, the mask (reticle) may contain a circuit pattern corresponding to an individual layer of the IC, and this pattern can then be imaged onto a target area (die) on a substrate (silicon wafer) which has been coated with a layer of photosensitive material (resist). In general, a single wafer will contain a whole network of adjacent dies which are successively irradiated through the reticle, one at a time. In one type of lithographic projection apparatus, each die is irradiated by exposing the entire reticle pattern onto the die in one go; such an apparatus is commonly referred to as a wafer stepper. In an alternative apparatus—which is commonly referred to as a step-and-scan apparatus—each die is irradiated by progressively scanning the reticle pattern under the projection beam in a given reference direction (the "scanning" direction) while synchronously scanning the wafer table parallel or anti-parallel to this direction; since, in general, the projection system will have a magnification factor M<1, the speed v at which the wafer table is scanned will be a factor M times that at which the reticle table is scanned. More information with regard to lithographic devices as here described can be gleaned from International Patent Application WO 97/33205.

A step-and-scan exposure apparatus is described in WO 97/33204. In this apparatus, reticle masking blades are used to define a slit through which an illumination beam passes to illuminate a rectangular portion of a reticle, an image of which is projected onto a wafer with a magnification M. The reticle is moved so that the illuminated portion scans the whole pattern to be imaged. The wafer is moved synchronously at a speed M times that of the reticle in the opposite direction to the reticle so that the whole pattern is imaged onto the wafer. At the end of a scan the wafer is stepped to the beginning of the next field to be illuminated, and the illumination process is repeated.

It is important to ensure that the entire field is properly and uniformly illuminated. This requires that the slit, defined by the reticle masking blades, is constantly and uniformly illuminated throughout the scan. Control of the exposure in a scanning exposure system has therefore been a problem.

SUMMARY OF THE INVENTION

It is an object of the present invention to provide a lithography apparatus having improved control over the field illumination uniformity.

The present invention relates to dose control in a lithographic projection apparatus having:

- a radiation system for supplying a projection beam of radiation;
- a first object table movable in at least a first direction, the scan direction, and provided with a mask holder for holding a mask having a mask pattern;
- a second object table movable in the first direction and provided with a substrate holder for holding a substrate; and
- a projection system for imaging an irradiated portion of the mask onto a target portion of the substrate with a magnification M.

According to the present invention, this and other objects are achieved in a lithographic projection apparatus as defined above, in which:

- the radiation system is adapted to supply a projection beam whose cross-section in the plane of the mask is smaller than the mask pattern, the radiation system including movable beam masking means for controlling the cross-section of the projection beam;
- control means for causing the beam masking means to be closed prior to, and open at, the beginning of a scan; and
- compensation means for compensating for a variation in radiation intensity of the projection beam on the mask whilst the beam masking means are opening.

The present inventors have determined that exposure (dose) errors occur at the beginning and end of the scan and are caused by reflections from the reticle masking blades. The present invention therefore provides means for compensating for the increased illumination as the slit defined by the beam masking means (e.g. reticle masking blades) is opened and closed. The present invention enables the slit illumination to be controlled so as to be constant and uniform throughout the scan, thus is improving the consistency and yield of an IC manufacturing process employing the inventive apparatus.

Preferably said compensation means comprise radiation source control means adapted to control the output of the radiation source (e.g. lamp), which is employed to produce the illumination beam, in accordance with the degree of opening of the beam masking means, to compensate for said variation.

Alternatively or in addition, said compensating means may be such that the beam masking means are constructed of a material substantially transparent to said illumination beam and are shaped so that portions of said illumination beam incident thereon are totally internally reflected.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target area", respectively.

In a manufacturing process using a lithographic projection apparatus according to the invention a pattern in a mask is imaged onto a substrate which is at least partially covered by a layer of energy-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping) metallisation, oxidation, chemomechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-0 067250-4.

BRIEF DESCRIPTION OF THE DRAWINGS

The present invention and its attendant advantages will be described below with reference to exemplary embodiments and the accompanying schematic drawings, in which.

In the Figures, like parts are indicated by like reference numerals.

DETAILED DESCRIPTION OF THE PREFERRED EMBODIMENTS

Figure 1:
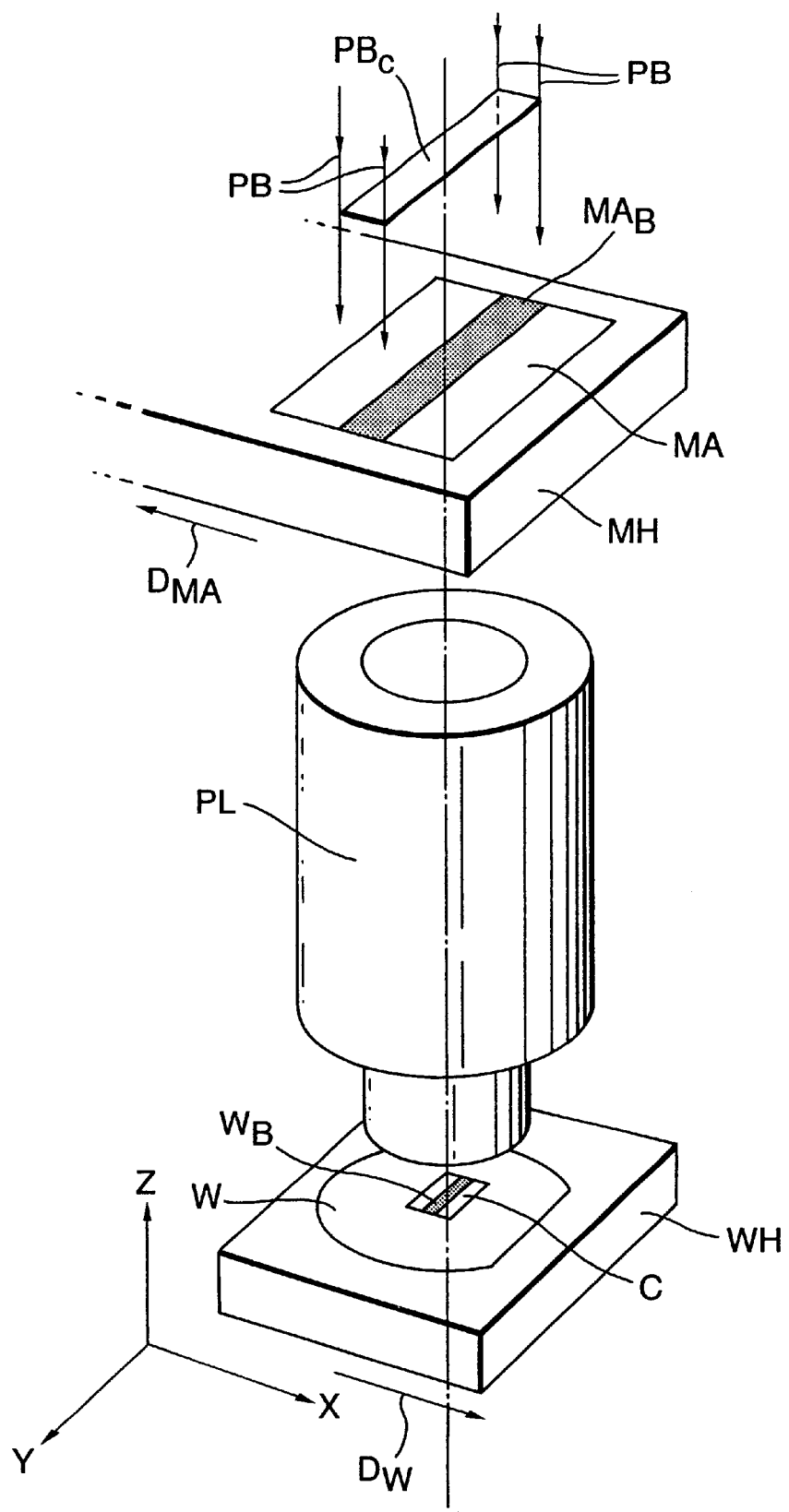
FIG. 1 depicts a lithographic projection apparatus according to a first embodiment of the invention.

The principle of a step-and-scan illumination system according to a first embodiment of the invention is shown in FIG. 1 of the accompanying drawings. This Figure shows a demagnified image of the mask MA formed on the substrate W mounted on table WH in a step-and-scan apparatus; the magnification M of the projection lens system is, for example, ¼. The projection beam PB is partially obstructed by reticle masking blades (not shown) so as to have, at the area of the mask, for example, a rectangular cross-section $PB_c$ so that a rectangular part $MA_B$ of this mask is illuminated. This part is imaged by the projection lens system PL on a similarly rectangular part $W_B$ of the substrate W. By moving the mask with respect to the substrate synchronously in opposite X directions, as is shown by way of the arrows $D_{MA}$ and $D_W$ in FIG. 1, and by taking the magnification M into account, the entire mask is successively illuminated and the entire mask pattern is imaged on an area C of the substrate. The mask and the substrate may also be moved in the same X direction.

After the mask pattern has been imaged on a first Integrated Circuit (IC) area (i.e. target area), the substrate holder is moved with respect to the mask along a distance which is equal to the period of the IC areas in the X direction or the Y direction, and the mask is imaged on a second IC area (i.e. target area) by the scanning radiation pattern $PB_c$.

Figure 2:
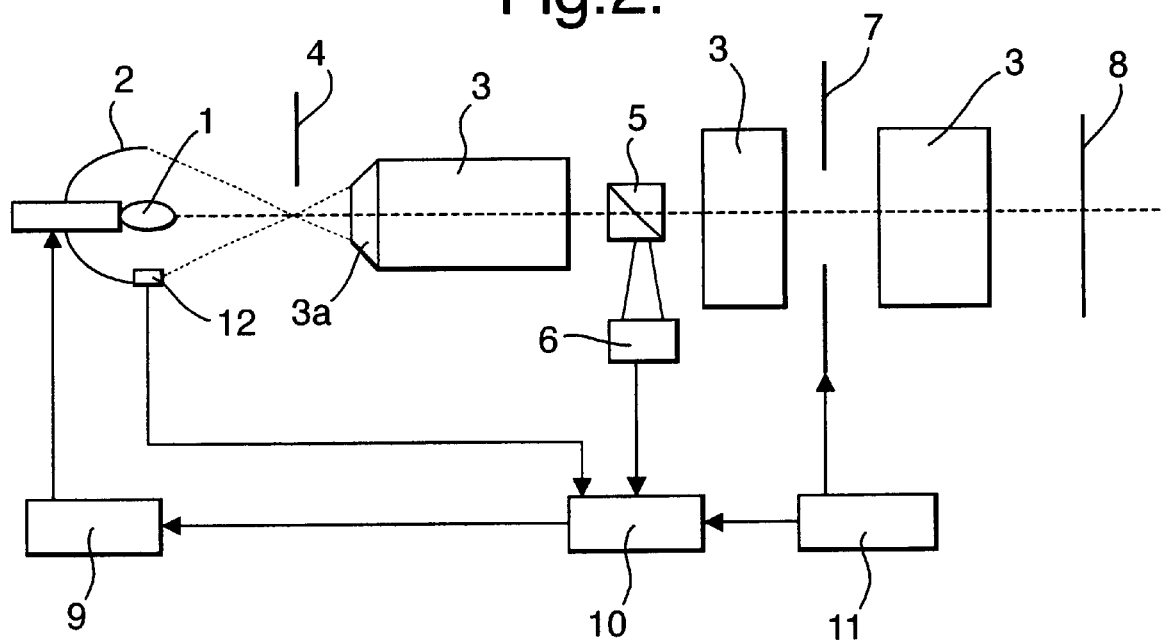
FIG. 2 is a diagram of the illumination optics of a scanning illumination system according to the invention.

The relevant components of an illumination system of a lithographic apparatus according to the present invention are shown schematically in FIG. 2. Light emitted by radiation source 1, e.g. a mercury lamp, is collected by elliptical mirror 2 and reflected into the first element 3a of the illumination optical system 3 which projects the light onto the reticle 8; the radiation source may also be a laser. Such a radiation source may emit UV light having a wavelength of 365 nm, 248 nm, 193 nm or 157 nm, for example. A shutter 4 is provided between the lamp 1 and the illumination optical system 3. At a convenient point in the illumination optical system, a portion of the illumination light is diverted by a beam splitter 5 to energy sensor 6 to enable monitoring of the amount of optical energy reaching the reticle 8. The actual dimensions of the scanning radiation pattern are determined by reticle masking means 7 which define a slit through which the reticle is illuminated. The remaining components of the device are omitted for clarity but may be as illustrated in FIG. 1.

At the beginning of the scan of a field the reticle masking blades, which comprise the reticle masking means 7, are closed. As the scan begins, the leading blade in the scan direction moves to open the slit, the slit is then scanned over the field and at the end of the scan the following blade is moved to close the slit.

In a first embodiment of the invention, the lamp intensity is reduced when the slit is closed and increased in synchronism with the opening of the slit.

Specifically it has been determined that the illumination intensity is a linear function of the fraction, X, of the cross-section of the slit which at a given time is obscured (i.e. the open fraction is 1−X, and X=0 when the slit is fully open). Accordingly, the system comprises a lamp control circuit 10 which controls the lamp power supply 9 so that the lamp intensity follows a reciprocal linear function of X to ensure that the radiation intensity at wafer level is constant.

Data indicating the slit cross-section are provided to the lamp control circuit 10 by the reticle masking servo control 11.

The illumination intensity variation as a function of X differs for different combinations of slit cross-section and die size and therefore needs to be adjusted for each manufacturing sequence. The function may be measured each time. Alternatively, it may be measured in advance for a plurality of slit and die combinations and the relevant function for a given manufacturing run modeled from these reference functions.

In a second embodiment of the invention, the reticle masking blades are constructed to avoid reflecting the illumination light.

Figure 3:
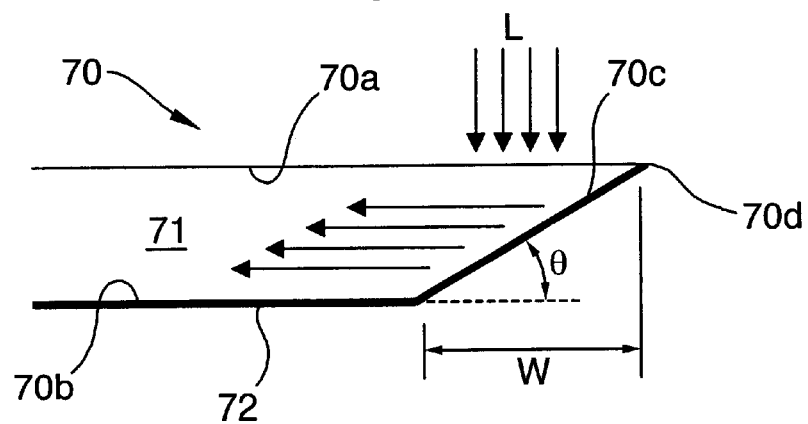
FIG. 3 is a cross-sectional view of part of a reticle masking blade employed as beam masking means in an embodiment of the invention.

As shown in FIG. 3, the reticle masking blade 70 has a main body 71 constructed of quartz. The front face 70a of the blade 70, on which the illumination light L is incident, is flat. The rear face 70b has an inclined portion 70c so that the blade is thinnest at its edge 70d. The angle θ of the inclined face 70*c* is set such that the illumination light incident on the front face 70*a* is totally internally reflected and directed sideways, out of the illumination beam, to an absorber. The front face 70*a* may be coated with an anti-reflection coating optimized for the illumination light frequency.

If so desired, the rear face of the blade 70 may be coated with a reflective metallic layer 72 (e.g. comprised of aluminum). The angle θ then no longer has to be chosen so that all light incident on the front face 70*a* undergoes total internal refection at the face 70*c* (since now conventional reflection will occur at the metallic layer 72).

Reflections from the reticle masking blades are thereby eliminated and the intensity density of the illumination light is made constant throughout the opening of the blades.

An alternative method proposed by the invention to compensate for the increase in intensity density of the illumination light is to control the scan speed. As mentioned above, the intensity density is a linear function of X. This can be compensated for by a linearly increasing scan speed. Since the scan speed is proportional to the slit cross-section and illumination intensity, but inversely proportional to the dose, it can be seen that the dose will be constant as a function of X. The reticle table and reticle masking blades must be controlled to move correspondingly with the scan speed defined above.

In this embodiment of the present invention the energy sensor 6 is positioned downstream of the shutter 4 because it is desired to place it as close to the reticle as possible to take account of the effect of as much of the illumination optical system as possible. This closed loop feedback control is advantageous when the shutter is open. However, when the shutter is closed no light reaches the sensor and it is therefore not possible to control the lamp on the basis of this sensor.

The present invention therefore provides an additional control system for use when the shutter is closed. This additional control loop may comprise a current control loop which provides open loop control of the lamp brightness through closed loop control of the current flowing through it. Alternatively an additional lamp sensor 12 is provided upstream of the shutter to detect the brightness of the lamp directly. A signal from the lamp sensor is fed to the lamp control circuit 10 which stabilizes the light flux.

It is necessary to control the switch over from control of the lamp by the lamp sensor 12 to control by the light sensor 6. The present invention provides three options for this.

Figure 4:
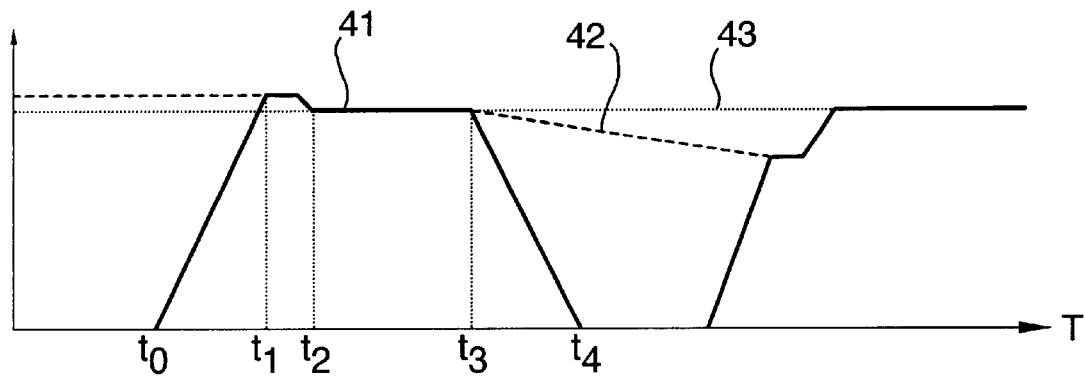
FIGS. 4 to 6 are graphs illustrating lamp output control modes of the invention.

Firstly, the shutter 4 is fully opened and the light sensor 6 and lamp 1 allowed to settle to the appropriate level under control of the light sensor 6 before the reticle masking blades 7 are opened and the scan begins. This method is very reliable but has a potential disadvantage in that throughput will be reduced if the lamp settling time is longer than the substrate table settling time. This control process is illustrated in FIG. 4. At time to the shutter opens and the energy detected by the light sensor 6, shown by solid line 41, rises to the level of the actual lamp output, shown by dashed line 42. At time $t_1$ when the shutter is fully open, the measured energy equals the actual lamp energy. The sensor is allowed to settle and the lamp output adjusted to the desired level, shown by dotted line 43. The exposure begins at $t_2$ and ends at $t_3$ during which time the lamp output is controlled on the basis of the lamp sensor 6. At the end of the exposure the lamp sensor signal falls off as the shutter closes until it reaches zero at $t_4$ when the shutter is fully closed.

Figure 5:
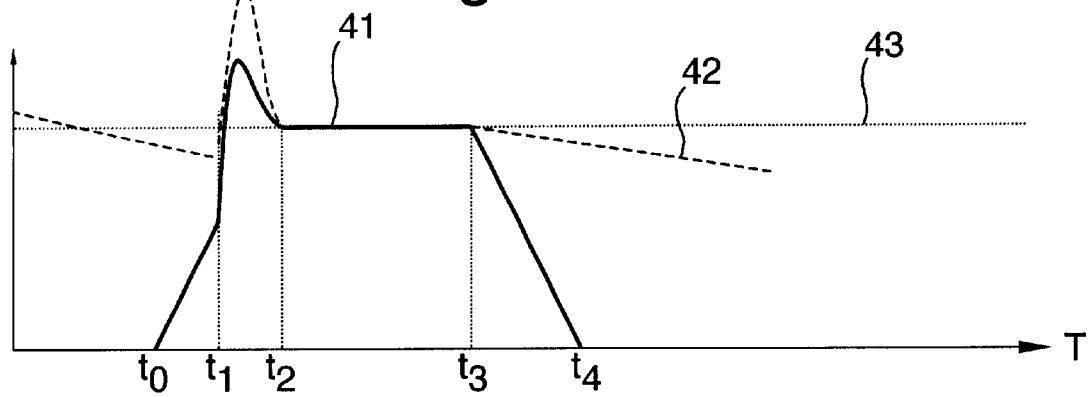

An alternative control strategy makes use of the known properties of the lamp control system and the known shutter opening time, e.g. 10 ms. This process is illustrated in FIG. 5. If control is switched to the light sensor 6 at time $t_1$, perhaps halfway through the shutter opening, the light sensor control will cause a large overshoot in the lamp power because the light sensor is only sensing half of its output. Because the light sensor control loop has a very fast response time, the lamp power will be brought quickly to the correct level by the time the exposure begins at $t_2$. Proper selection of the timing of changeover of control will ensure that the lamp is at the correct level most rapidly.

Figure 6:
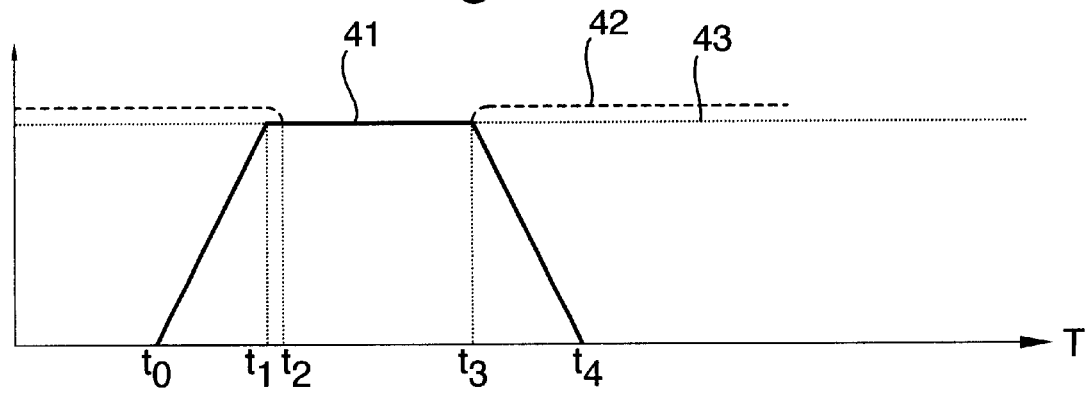

The third alternative is to operate both control loops simultaneously with the lamp power being controlled on the basis of the lower of the two controls and the set point for the shutter closed (i.e. lamp sensor) control loop set slightly higher than the desired energy level. This is shown in FIG. 6. When the shutter is closed the light sensor 6 control loop will command a very high lamp output so that control will follow the shutter closed control loop. As the shutter opens, beginning at $t_0$, the output level commanded by light sensor 6 will fall until $t_1$ when it drops below the shutter closed set point and the light sensor control takes over. The lamp output will fall quickly to the desired level and exposure can begin at $t_2$. When the shutter begins to close at $t_3$, the lamp output will rise as the light sensor 6 commands an increase in output to compensate for the reduction in light reaching it. Very soon however, the output commanded by the light sensor 6 will rise above the shutter closed set point and that control will therefore takeover. In this way switching between control loops is automatic.

We claim:

1. A lithographic projection apparatus comprising:
   a radiation system, said radiation system supplying a projection beam of radiation;
   a first object table movable in at least a first direction, the scan direction, and provided with a mask holder, said mask holder holding a mask having a mask pattern;
   a second object table movable in the first direction and provided with a substrate holder, said substrate holder holding a substrate;
   a projection system constructed and arranged to image an irradiated portion of the mask onto a target portion of the substrate with a magnification M,
      said radiation system being adapted to supply a projection beam whose cross-section in a plane of the mask is smaller than the mask pattern, the radiation system including a movable beam masking device constructed and arranged to control the cross-section of the projection beam;
   a control unit, said control unit causing the beam masking device to be closed prior to, and open at the beginning of, a scan; and
   a compensator constructed and arranged to compensate for a variation in radiation intensity of the projection beam on the mask while the beam masking device is opening.

2. A lithographic projection apparatus according to claim 1, wherein said compensator comprises a radiation source controller adapted to control the output of a radiation source used to produce the projection beam, in accordance with the degree of opening of the beam masking device, to compensate for said variation.

3. A lithographic projection apparatus according to claim 2, wherein said variation is an increase and said radiation source controller is adapted to reduce the radiation source output while the beam masking device is opening.

4. A lithographic projection apparatus according to claim 3, wherein said radiation source controller is adapted to control the radiation source output to follow a reciprocal linear function of X, where X is the obscured proportion of the cross-section of a slit defined by the beam masking device.

5. A lithographic projection apparatus according to claim 2, wherein said radiation source controller is adapted to control the radiation source output according to a function determined by:

the cross-section of the projection beam when the beam masking device is fully open, and the size of the reticle pattern to be imaged.

6. A lithographic projection apparatus according to claim 5, wherein said function is calculated from empirically derived reference values.

7. A lithographic projection apparatus according to claim 1, wherein said compensator is the beam masking device constructed of a material substantially transparent to said projection beam and embodied so that portions of said projection beam incident thereon undergo total internal reflection.

8. A lithographic projection apparatus according to claim 1 wherein said compensator comprises a reflective coating provided on a rear surface of said beam masking device relative to the direction of incidence of the projection beam.

9. A lithographic projection apparatus according to claim 8, wherein said rear surface of said beam masking device includes an inclined portion adjacent to an edge thereof.

10. A lithographic projection apparatus according to claim 8, wherein said reflective coating comprises aluminum.

11. A lithographic projection apparatus according to claim 7, wherein said material substantially transparent to said projection beam comprises quartz or glass.

12. A lithographic projection apparatus according to claim 1, wherein said radiation system comprises a radiation source and an illumination system including beam-shaping optical elements, said beam masking device comprising beam masking blades provided in, or downstream relative to the direction of propagation of said projection beam of, said illumination system.

13. A lithographic projection apparatus according to claim 12 further comprising a shutter provided between said radiation source and said illuminations system for selectively passing and blocking said projection beam.

14. A device manufacturing method comprising:

providing a substrate which is at least partially covered by a layer of energy-sensitive material;

providing a mask containing a pattern;

projecting an image of at least part of the mask pattern onto a target area of the layer of energy-sensitive material with a magnification M using a projection beam of radiation;

moving a mask during said projecting in a scan direction relative to said projection beam;

moving a substrate during said projecting along said scan direction at a rate equal to M times the rate at which the mask is moved;

providing a beam masking device that is closed prior to and opened at the beginning of said projecting; and compensating for a variation in radiation intensity of the projection beam on the mask while the beam masking device is opening.

15. A device manufactured in accordance with the method of claim 14.

* * * * *